United States Patent
Hennig

(10) Patent No.: US 6,246,238 B1
(45) Date of Patent: Jun. 12, 2001

(54) METHOD FOR THE PRODUCTION OF NUCLEAR MAGNETIC SPECTROSCOPY SIGNALS THROUGH SPATIAL MODULATION OF Z-MAGNETIZATION

(75) Inventor: Jürgen Hennig, Freiburg (DE)

(73) Assignee: Universitätsklinikum Freiburg, Freiburg (DE)

( * ) Notice: Subject to any disclaimer, the term of this patent is extended or adjusted under 35 U.S.C. 154(b) by 0 days.

(21) Appl. No.: 09/186,422

(22) Filed: Nov. 5, 1998

(30) Foreign Application Priority Data

Nov. 13, 1997 (DE) .............................. 197 50 214

(51) Int. Cl.[7] .................................................. G01V 3/00
(52) U.S. Cl. .............................................. 324/307; 324/314
(58) Field of Search ................................. 324/307, 309, 324/312, 314, 306, 300

(56) References Cited

U.S. PATENT DOCUMENTS

| | | | |
|---|---|---|---|
| 4,748,409 | 5/1988 | Frahm et al. . | |
| 4,774,466 | 9/1988 | Sattin . | |
| 5,121,059 | * 6/1992 | Wieland | 324/309 |
| 5,339,035 | * 8/1994 | Schneider et al. | 324/309 |
| 5,345,174 | * 9/1994 | Kimmich et al. | 324/309 |

FOREIGN PATENT DOCUMENTS

| | | |
|---|---|---|
| 3434161A1 | 3/1986 | (DE) . |
| 3445689A1 | 6/1986 | (DE) . |
| 19612217C1 | 8/1997 | (DE) . |

OTHER PUBLICATIONS

Hahn, E. L. : Spin Echoes in Phys.Rev. 80 : 580–594 (1950).
Hennig, J. : Chemical Shift Imaging with Phase–Encoding RF Pulses in Magnetic Resonance in Medicine, 25, pp. 289–298 (1992).
Stark and Bradley: Mosby Year Book, Magnetic Resonance Imaging, pp. 1627–1628.

* cited by examiner

Primary Examiner—Louis Arana
(74) Attorney, Agent, or Firm—Paul Vincent

(57) ABSTRACT

A method for magnetic resonance imaging (NMR) subjects a sample of magnetic spins, having differing Larmor frequencies and located in an external magnetic field, to a sequence of at least two radio frequency pulse sequences in time separation tm with respect to each other, wherein the difference in Larmor frequencies is due to the type of nuclei, to the inhomogeneities of the magnetic field utilized, or through action of an additional magnetic field gradient and wherein the first radio frequency pulse sequence effects excitation of, relative to the distribution of Larmor frequencies, periodic modulation of the z-magnetization having a modulation separation $2\Delta\omega$ and the second radio frequency pulse sequence transfers this periodic modulating z-magnetization into transverse magnetization leading to signal production. The method is characterized in that at least one of the radio frequency pulse sequences utilized has a periodic rectangular excitation shape having a modulation separation $2\Delta\omega$ so that, following a certain time determined by the modulation separation $2\Delta\omega$, at least a partial coherence of transverse magnetization results and thereby a measurable NMR signal. In this manner, an improved stimulated echo signal can be created.

10 Claims, 12 Drawing Sheets

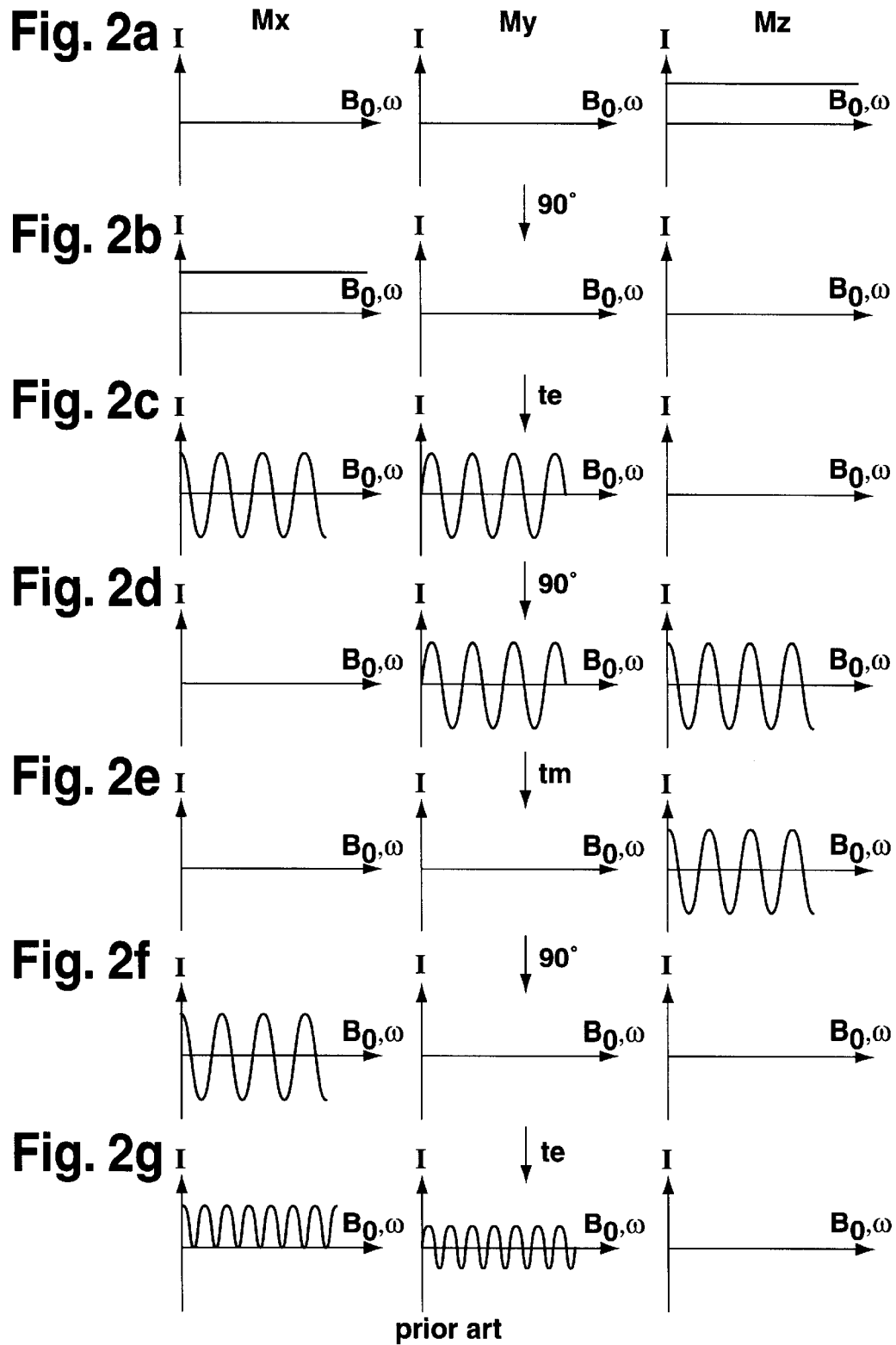

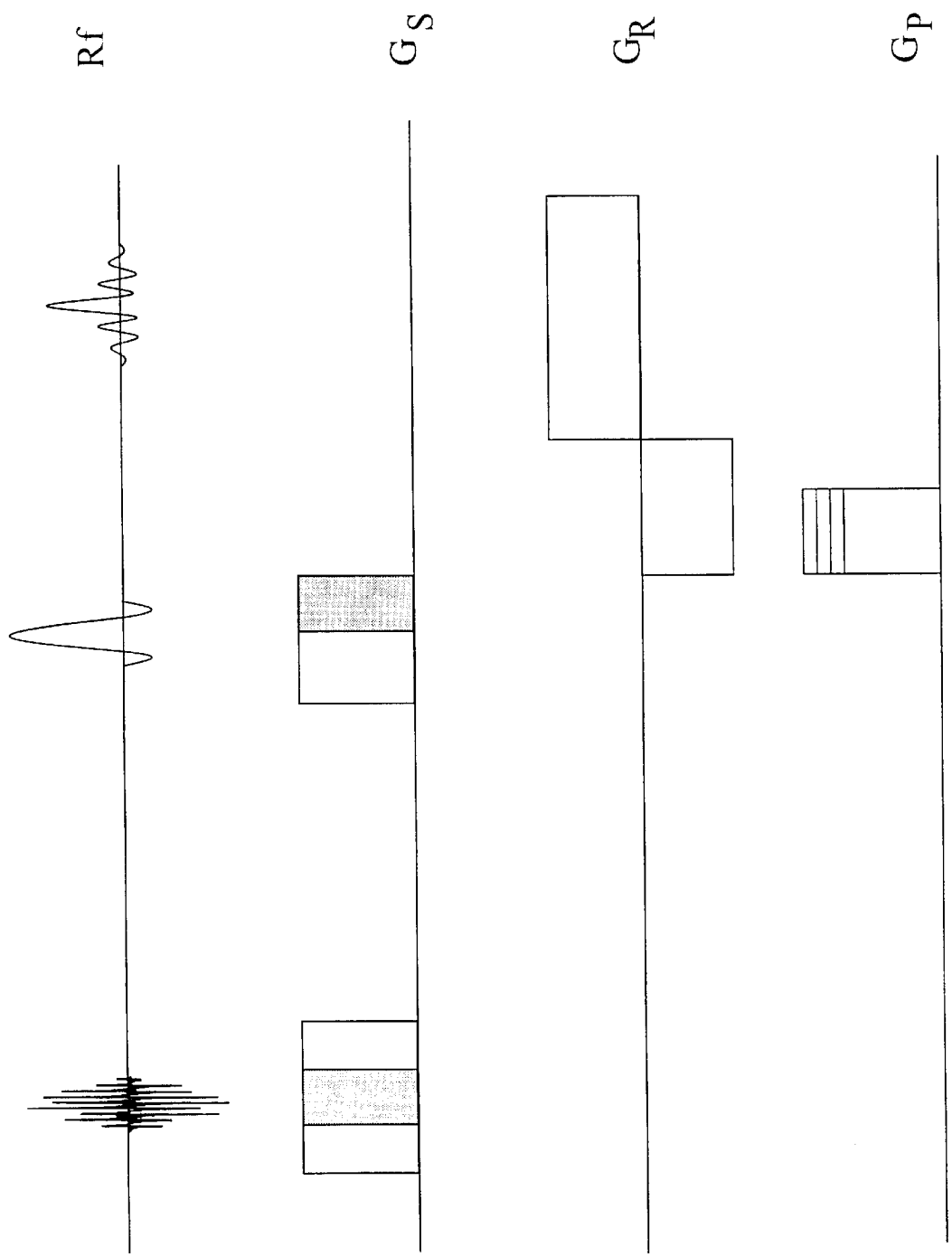

↓ MODULATION PULSE (180°)

↓ tm

↓ MODULATION PULSE (90°)

MODULATION PULSE (180°)

tm

READ-OUT PULSE (90°)

te

METHOD FOR THE PRODUCTION OF NUCLEAR MAGNETIC SPECTROSCOPY SIGNALS THROUGH SPATIAL MODULATION OF Z-MAGNETIZATION

This application claims Paris Convention priority of German patent application number 197 50 214.8 filed Nov. 13, 1997 the complete disclosure of which is hereby incorporated by reference.

BACKGROUND OF THE INVENTION

The invention concerns a method of nuclear magnetic resonance (NMR) with which a sample of magnetic spins having differing Larmor frequencies and located in an external magnetic field are subjected to a sequence of at least two radio frequency pulse sequences separated in time by tm, wherein the differences in the Larmor frequencies are given either by the type of nuclei or in consequence of inhomogeneities of the magnetic field used or through the effect of an additional magnetic field gradient and wherein the first radio frequency pulse sequence effects production of a periodic modulation of the z-magnetization, with respect to the distribution of Larmor frequencies, having a modulation separation $2\Delta\omega$ and the second radio frequency pulse sequence transfers this periodically modulated z-magnetization into transverse magnetization, leading to a signal.

A method of this kind is e.g. known in the art from DE 34 45 689 A1.

The invention concerns an imaging method to improve the signal intensity of so-called stimulated echoes. Embodiments of this type of signal creation known to date have, compared to directly refocussed spin echoes, the disadvantage of a reduction in amplitude of 50%. The method in accordance with the invention discloses a way in which this disadvantage can be avoided leading to the creation of stimulated echoes having, in the limiting case, an amplitude identical to that of the spin echo.

The mechanism for creation of an NMR-signal in the form of a stimulated echo was introduced in 1950 by Hahn (Hahn, E. L., Spin Echoes, Phys.Rev. 80:580–594 (1950)). This work considered stimulated echoes as a special case of spin echoes. Modern vernacular, however, refers to spin echoes as those signals produced by refocussing of transverse magnetization using a radio frequency pulse. This nomenclature is utilized below.

The literature discloses a series of measuring processes based on signal production using stimulated echoes. Stimulated echoes have the particular advantage that, in contrast to spin echoes, the magnetization is maintained as z-magnetization during a portion of the preparation interval during which it is not subject to the dephasing mechanisms active for transverse magnetization. In addition, the magnetization decays during the associated time interval with the longitudinal relaxation time T1 which, in particular for in vivo applications, is substantially longer than the transverse relaxation time relevant for spin echoes T2. However, this advantage is associated with the fact that stimulated echoes have a reduction in single amplitude of 50% relative to spin echoes. For this reason, stimulated echoes are only preferred relative to spin echoes if this disadvantage is compensated by the length of the excitation sequence in conjunction with the slower T1 signal decay. This is currently the case, in particular, for methods for diffusion weighted imaging in accordance with the principal of Stejskal-Tanner. In most other NMR methods, spin echoes are preferentially used, since the signal loss of approximately a factor of 2 is viewed as being disadvantageous due to the intrinsic signal to noise problems in NMR.

FIGS. 2a–2g show the mechanism for forming stimulated echoes according to prior art. The components Mx, My and Mz are thereby shown as a function of the resonance frequency (and thereby of the magnetic induction $B_0$ at the location of the nuclei due to the Larmor relationship $\omega=\gamma B_0$ with $\gamma$=the geomagnetic ratio). The following description assumes that the magnetization is equally distributed as a function of $\omega$. Such an equal distribution can be most easily effected through application of a constant magnetic field gradient across the sample under investigation, should it not already be present due to the type of sample under investigation.

In this case, the following conditions obtain: All magnetization is initially directed as z-magnetization having an amplitude $M_0$. (FIG. 2a). Mz is transferred into Mx via a 90° pulse having phase $\gamma$. (FIG. 2b). Following a time te, the transverse magnetization diephases. Mx=$M_0$, cos($\omega$te), My=$M_0$ sin($\omega$te). (FIG. 2c). An additional 90° pulse once more transfers Mx into Mz with My initially remaining constant. (FIG. 2d). Following an additional waiting time tm, the transverse magnetization My decays with the time constant T2 due to the transverse relaxation, with Mz remaining basically preserved due to the assumed substantially longer T1. (FIG. 2e). The sinusoidal modulated z-magnetization is once more transferred into Mx by means of an additional 90° pulse. (FIG. 2f).

Following a time interval te, which is identical to the time interval te between steps b) and c), the transverse magnetization is modulated in accordance with Mx=$M_0$ cos$^2$ (wte), My=$M_0$ cos($\omega$te)sin $\omega$te. The observed signal amplitude S results from the integral over the transverse magnetization and is therefore S=½$M_0$. This signal is the stimulated echo (FIG. 2g).

This illustration of the stimulated echo generation mechanism in accordance with FIGS. 2a–2g clearly shows that the signal loss of 50% is due to the fact that, when applying the second 90° pulse, half of the entire magnetization (namely Mx) is transferred into z-magnetization, whereas the other half remains as transverse magnetization and therefore decays during the time interval tm.

SUMMARY OF THE INVENTION

Departing therefrom, the method improvement underlying the present invention can now be illustrated. Same consists essentially in that the z-magnetization of FIG. 2a is directly transferred into a magnetization modulated with $\omega$ without having an intermediate step leading to a subsequent loss in transverse magnetization (FIGS. 2a–2g).

BRIEF DESCRIPTION OF THE DRAWINGS

FIG. 2a shows an initial spin magnetization in a spin echo pulse sequence of prior art;

FIG. 2b shows the spin magnetization change with respect to FIG. 2a following a 90° pulse of phase y;

FIG. 2c shows the spin magnetization change with respect to FIG. 2b following a waiting time te;

FIG. 2d shows the spin magnetization change with respect to FIG. 2c following an additional 90° pulse;

FIG. 2e shows the spin magnetization change with respect to FIG. 2d following a waiting time tm;

FIG. 2f shows the spin magnetization change with respect to FIG. 2e following an additional 90° pulse;

FIG. 2g shows the spin magnetization change with respect to FIG. 2f following a time interval te;

FIG. 4b illustrates a first variation of the sequence of FIG. 4a;

FIG. 4c illustrates a second variation of the sequence of FIG. 4a;

FIG. 7b shows a first variation of the pulse sequence of FIG. 7a;

FIG. 7c shows a second variation of the pulse sequence of FIG. 7a;

FIG. 8 illustrates an embodiment of the invention for a first imaging application.

Figure 3:
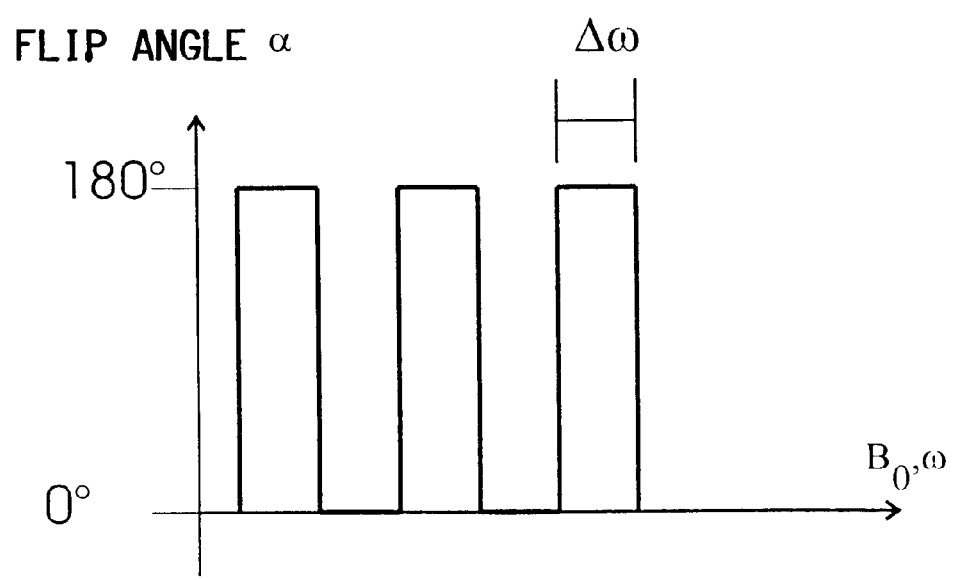
FIG. 3 illustrates a first preferred rectangular modulation pulse in accordance with the invention.

A preferred method of generating the z-magnetization, utilizes a rectangular modulation in accordance with FIG. 3. Methods for generating such a modulation pulse to effect a rectangular modulation of the z-magnetization of the desired kind are per se known in the art in the literature (see Hennig, J., Mag.Reson.Med. 25,289–98 (1992)). They consist essentially of an overlap of n individual pulses having rectangular inversion shapes which are each displaced with respect to each other by $2\Delta\omega$.

Also per se known in the literature are methods for optimizing such individual pulses, primarily with regard to a limitation of the required radio frequency power (see above). A successive application of the n individual pulses, each having a rectangular inversion shape, is less efficient but nevertheless possible, in particular, if the relaxation time T1 is substantially longer than the time interval required for the sequence of individual pulses.

Figure 1A:
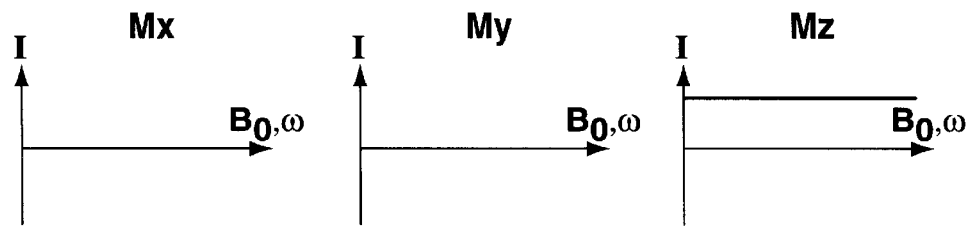
FIG. 1a shows an initial spin magnetization of a first embodiment of the invention.
Figure 1B:
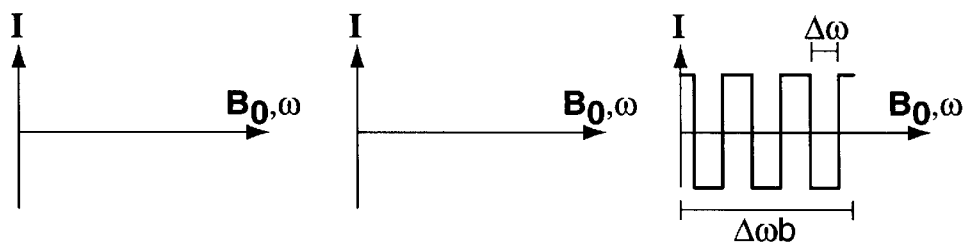
FIG 1b shows the spin magnetization change with respect to FIG. 1b following a 180° modulation pulse.
Figure 1C:
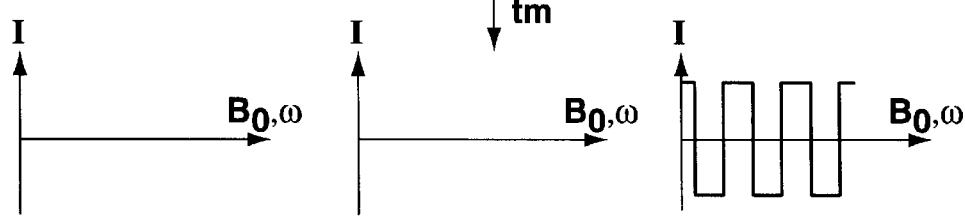
FIG. 1c shows the spin magnetization change with respect to FIG. 1b following a waiting time tm.
Figure 1D:
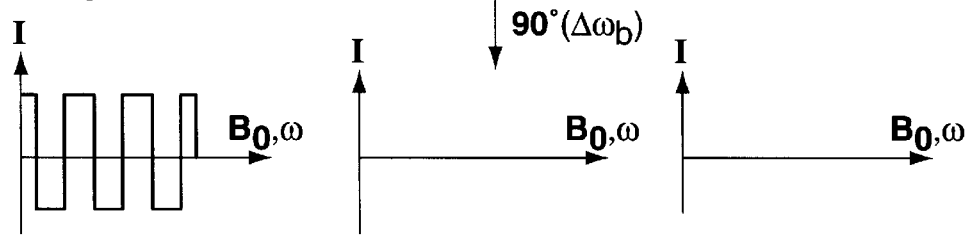
FIG. 1d shows the spin magnetization change with respect to FIG. 1c following a 90° pulse of bandwidth $\Delta\omega_b$.

Following a waiting time tm, the z-magnetization prepared in this manner (FIG. 1b, FIG. 1c) can most easily be transferred into Mx by means of a 90° excitation pulse having an excitation bandwidth $\Delta\omega_b$. The time evolution of the spins lead to the situation shown (in FIG. 1e) for which:

$$Mx=|M_0 \cos(2\Delta\omega te)|. \qquad (1)$$

The signal intensity S then also results through integration giving $$S=2/\pi M_0, \qquad (2)$$

which is approximately $0.63 M_0$.

If the dephasing gradient is constant, the entire sequence causes the signal to form at a time $$te=1/(2\Delta\omega) \qquad (3)$$

This signal is designated as a z-modulation echo in correspondence with the mechanism of signal production.

Figure 4A:
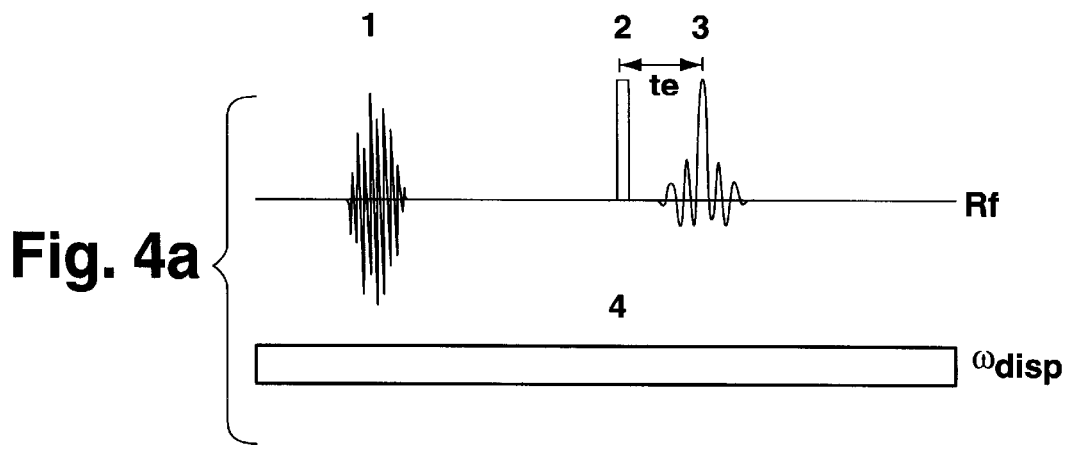
FIG. 4a illustrates a first pulse sequence carrying out the method in accordance with the invention.

This is already a signal increase of more than 25% compared to the conventional stimulated echo. A simple measuring sequence following this principle is shown in FIG. 4a, wherein "1" designates the z-modulation pulse, "2" the excitation pulse normally having a 90° flip angle utilized for signal read-out, "3" the excited signal occurring after $te=1/(2\Delta\omega)$, and "4" the processes $\omega_{disp}$ which serve to evenly distribute the spin densities as a function of the observation frequency (that is to say, in the simplest case, using a magnetic field gradient of constant strength). These conditions could obtain due to the physical properties of the sample (field inhomogeneity, line width of the substance being observed).

Such an even distribution can, however, also be generated through application of a magnetic field gradient. An at least approximately equal distribution must thereby obtain over the frequency range of Larmor frequencies of observed spins measured in the experiment. The relevant measuring volume over which the approximately equal distribution is present, is thereby determined by the sample volumes separately measured in the experiment. In a conventional NMR-experiment this corresponds to the sensitive volume of the receiver coil and, in a magnetic resonance tomograph resolved method, to the volume of a separately detected space (voxel) or image (pixel) element. If the spatial resolution of the experiment is higher than the modulation separation, the condition of equal distribution of magnetization over the detected frequency range required for formation of a coherence of magnetization at the time of signal generation is not satisfied and the formation of the stimulated echo analog signal does not occur. Such an observable spatial modulation of the z-magnetization can, e.g., be utilized to generate a modulation pattern in the sense of a tagging experiment known per se in the art (see Magnetic Resonance Imaging, Eds. Stark and Bradley, Mosby Year Book, 1992, pages 1627–28).

Since the magnetization between the pulses 1 and 2 is present in the form of z-magnetization and thereby insensitive to dephasing effects, the presence of $\omega_{disp}$ in this time interval is not absolutely necessary.

One should also point out that the point of time of read-out of the signal when utilizing time varying magnetic fields can be influenced if the gradient strength during the modulation pulse is different than that used for generating the signal. It is thereby often advantageous to utilize pulses which are as short as possible (e.g. 1–2 ms when utilizing a method associated with whole body tomography) in order to avoid relaxation effects during the modulation pulse Such pulses produce, in dependence on the pulse shape, typical modulation intervals $\Delta\omega$ in the vicinity of 1–5 kHz. In accordance with equation (3), the corresponding signal formation occurs following less than 1 ms. A later read-out can be effected through corresponding reduction or delay in application of the gradients responsible for signal formation (FIG. 4b and FIG. 4c).

Figure 5:
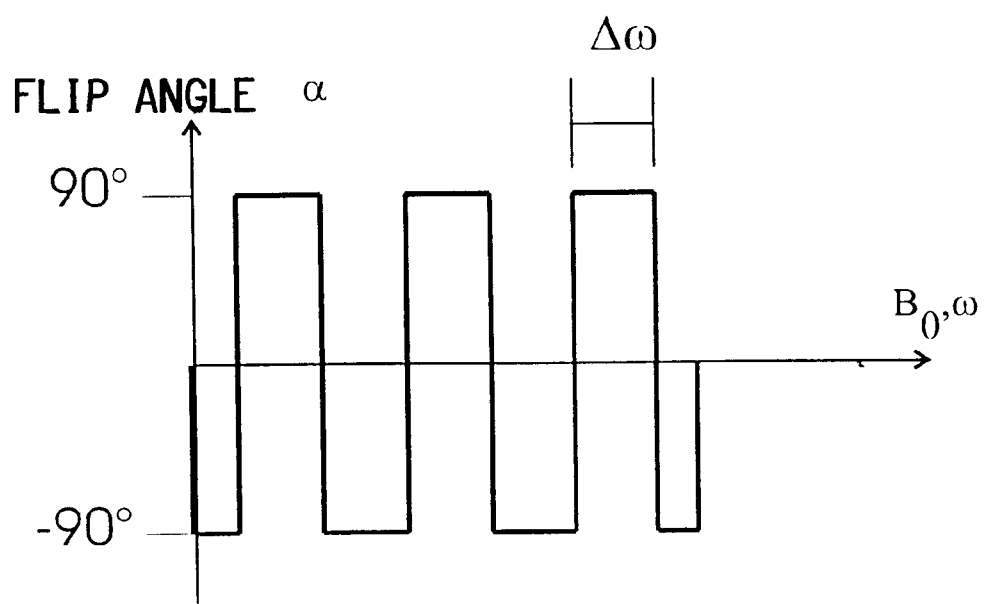
FIG. 5 shows a second preferred rectangular modulation pulse in accordance with the invention.
Figure 6A:
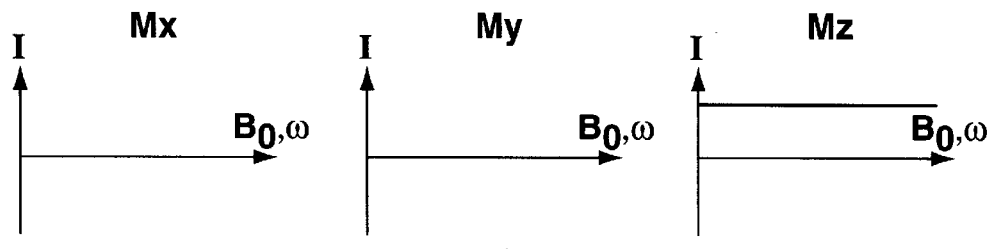
FIG. 6a shows an initial spin magnetization in a second embodiment of the invention.
Figure 6B:
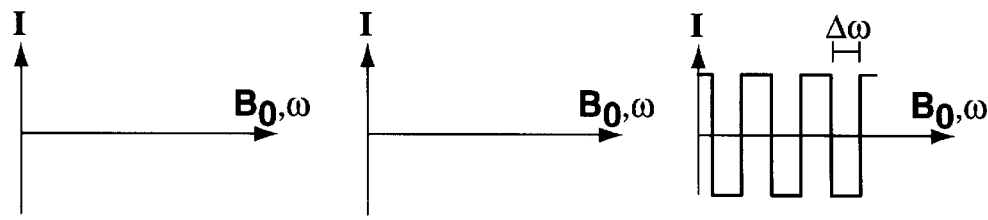
FIG. 6b shows the spin magnetization change with respect to FIG. 6a following a 180° modulation pulse.
Figure 6C:
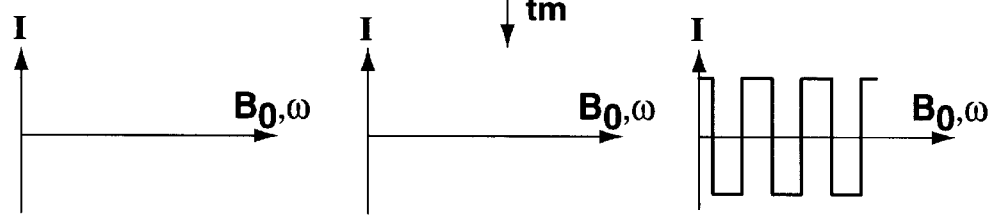
FIG. 6c shows the spin magnetization change with respect to FIG. 6b following a waiting time tm.
Figure 6D:
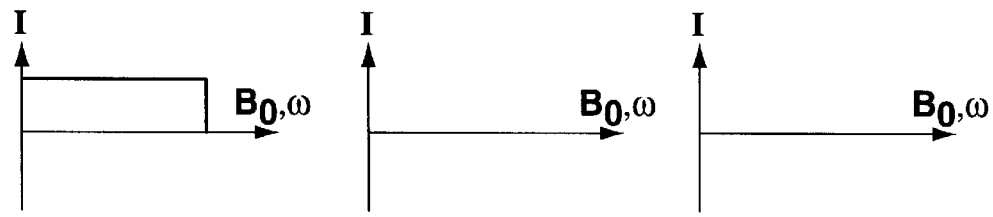
FIG. 6d shows the spin magnetization change with respect to FIG. 6c following a 90° modulation pulse.

An additional clear improvement in signal intensity in such an experiment can be effected by also using a modulation pulse to excite the modulated z-magnetization having an excitation profile shown in FIG. 5. This pulse transfers both positive as well as negative z-magnetization into (positive) transverse magnetization. In the ideal case, all magnetization is thereby present directly following this pulse (FIGS. 6a, 6b, 6c, and 6d) as a coherent signal having a intensity $S=M_0$.

Figure 4B:
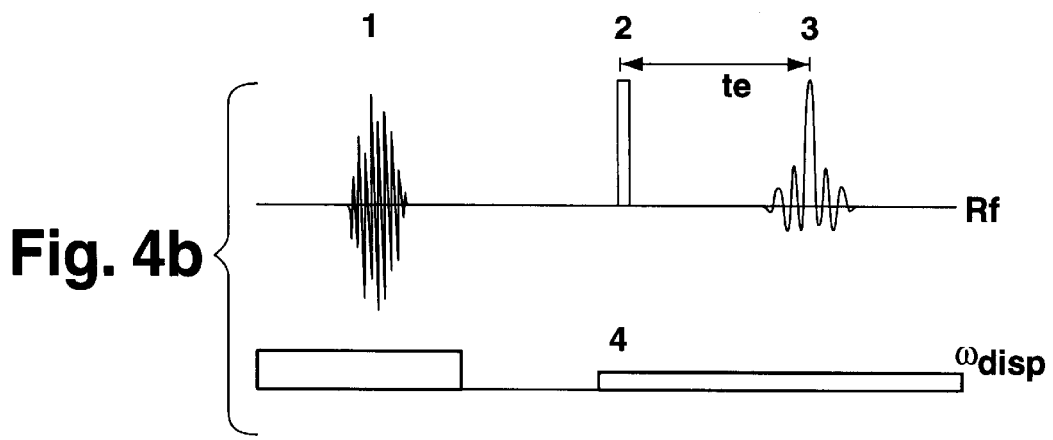
Figure 4C:
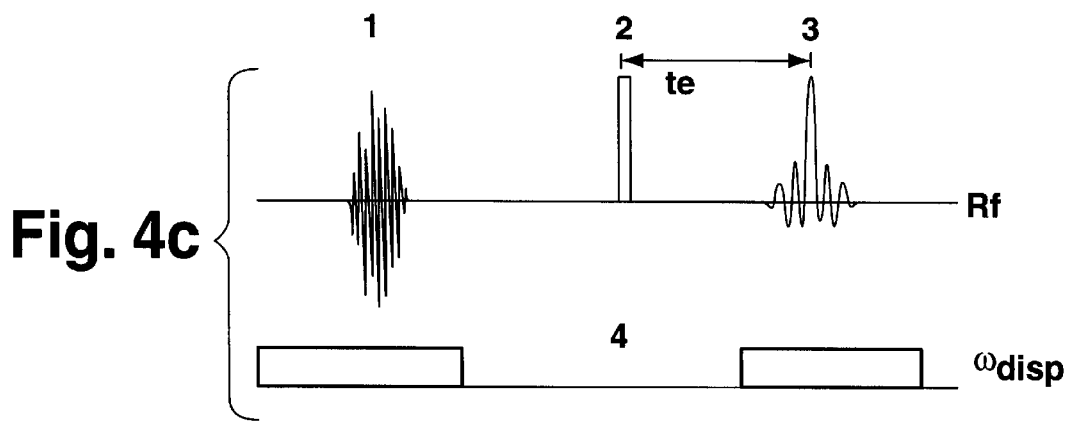
Figure 7A:
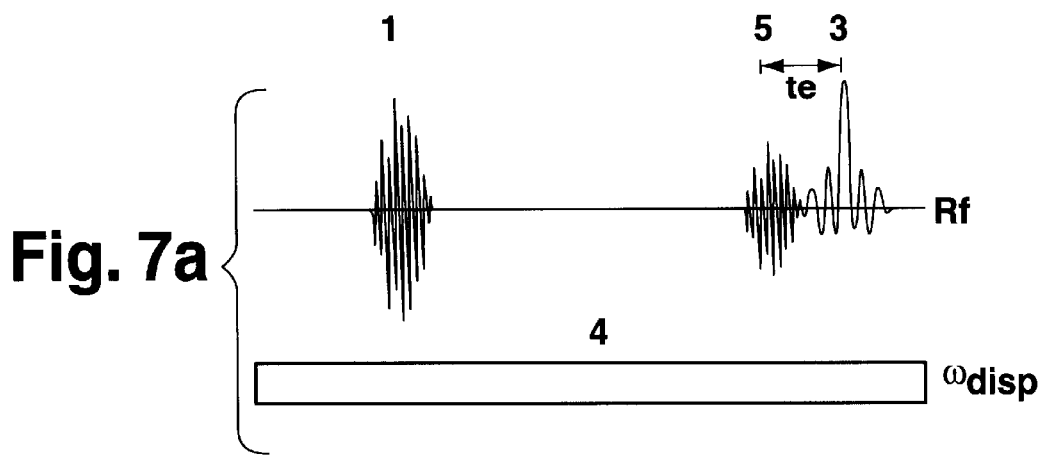
FIG. 7a shows a second pulse sequence for carrying out the method in accordance with the invention.

The pulse sequence associated therewith is shown in FIG. 7a, wherein, compared to FIGS. 4a–4c, the read-out pulse 2 is replaced by the excitation modulation pulse 5 described and shown more closely in FIG. 5.

An excitation pulse having the corresponding excitation shape can, in first approximation, likewise be effected through superposition of individual pulse shapes displaced with respect to each other by $\Delta\omega$. Due to the non-linearity of the behaviour of a spin system, as described by the Bloch equations, use of improved calculation techniques are preferred therefor, as are also per se known in the art and described in the literature.

Figure 7B:
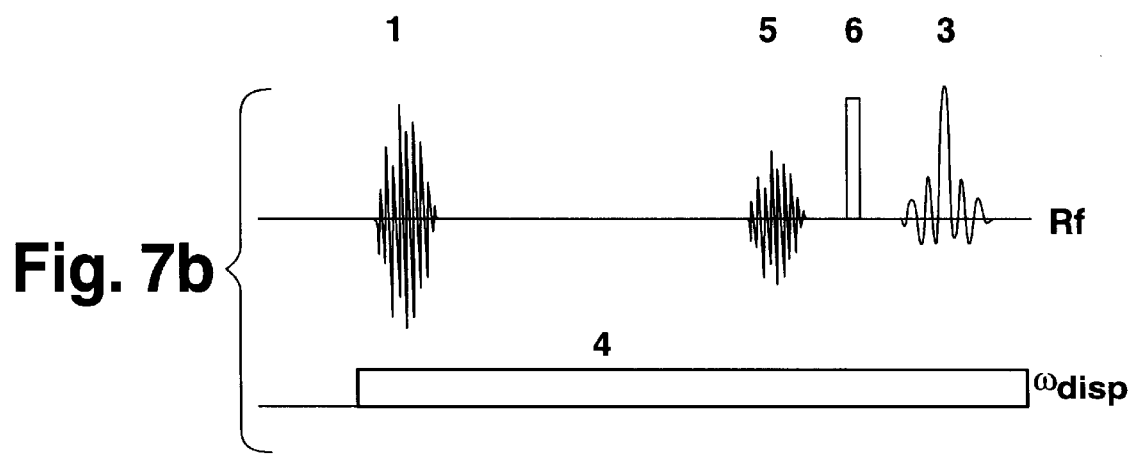
Figure 7C:
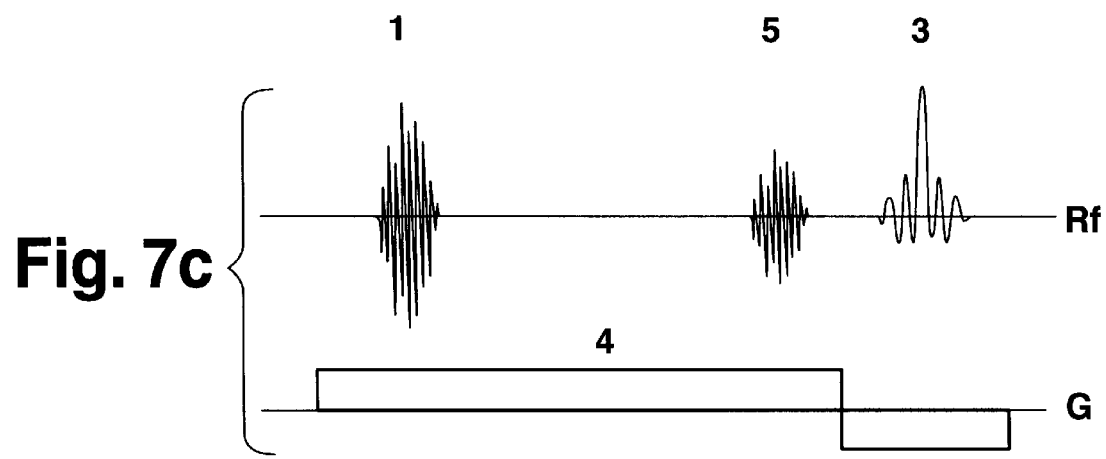

For practical applications, the modulation pulse has a finite time duration resulting from the band width of the modulation period of the pulse. This finite pulse duration causes, in general, a dephasing of the spin system after the modulation-excitation pulse. It is thereby generally advantageous to effect signal read-out either using a subsequent spin echo (FIG. 7b), generated with an additional refocussing pulse 6 or, in particular, with a magnetic field gradient G used as a $\omega_{disp}$ mechanism through gradient reversal in the form of a gradient echo (FIG. 7c).

When utilizing a constant magnetic field gradient G, the modulation separation $\Delta\omega$ in frequency units corresponds to a spatial modulation along the gradient having a modulation width $$s_m = \Delta\omega / \gamma G \qquad (4).$$

Other methods for signal read-out are known to one of average skill in the art and are immediately evident from the fact that the magnetization following completion of pulses 1 and 5 is present, with regard to its subsequent signal dependence, as if the excitation were effected by one single excitation pulse.

Modulation pulses can be used to initially create a sinusoidally modulated z-magnetization through successive application of two 90° pulses separated by dephasing individual te, wherein dephasing is generated by suitable technical methods (use of magnetic field gradients) or through the boundary conditions present in the experiment (magnetic field inhomogeneities). If the magnetization is subsequently changed using a modulation pulse in accordance with FIG. 5, with the modulation separation corresponding to one half of the dephasing period during the excitation phase, modulated transverse magnetization identical to FIG. 1e thereby results having a signal amplitude $2/\pi$.

One should thereby mention, that the modulation pulse must not, in any event, have a shape precisely identical to that shown in FIGS. 5, 7a, 7b, and 7c. The modulation pulse must not have exactly three intervals of negative amplitude. The number ni of inverted sections should solely be 1 or more, and the implicit condition that $\Delta\omega_b$ be larger than $\Delta\omega$ must obtain. For the methods based on FIGS. 6a–6d and FIGS. 7a, 7b and 7c, it is not even necessary that the rectangular modulation of the z-magnetization be periodic. Even irregular modulation patterns having irregular positions and widths for the inverted portions of the z-magnetization lead to the desired signal to the extent that one provides that the excitation shape of the modulation pulse ("5" in FIGS. 7a–7c) corresponds to that of the z-modulation pulse ("1" in FIGS. 7a–7c) so that, in the ideal case, as coherent a transverse magnetization as possible results, in correspondence with FIG. 6d. The phase position of the pulses can also be freely chosen.

Figure 9:
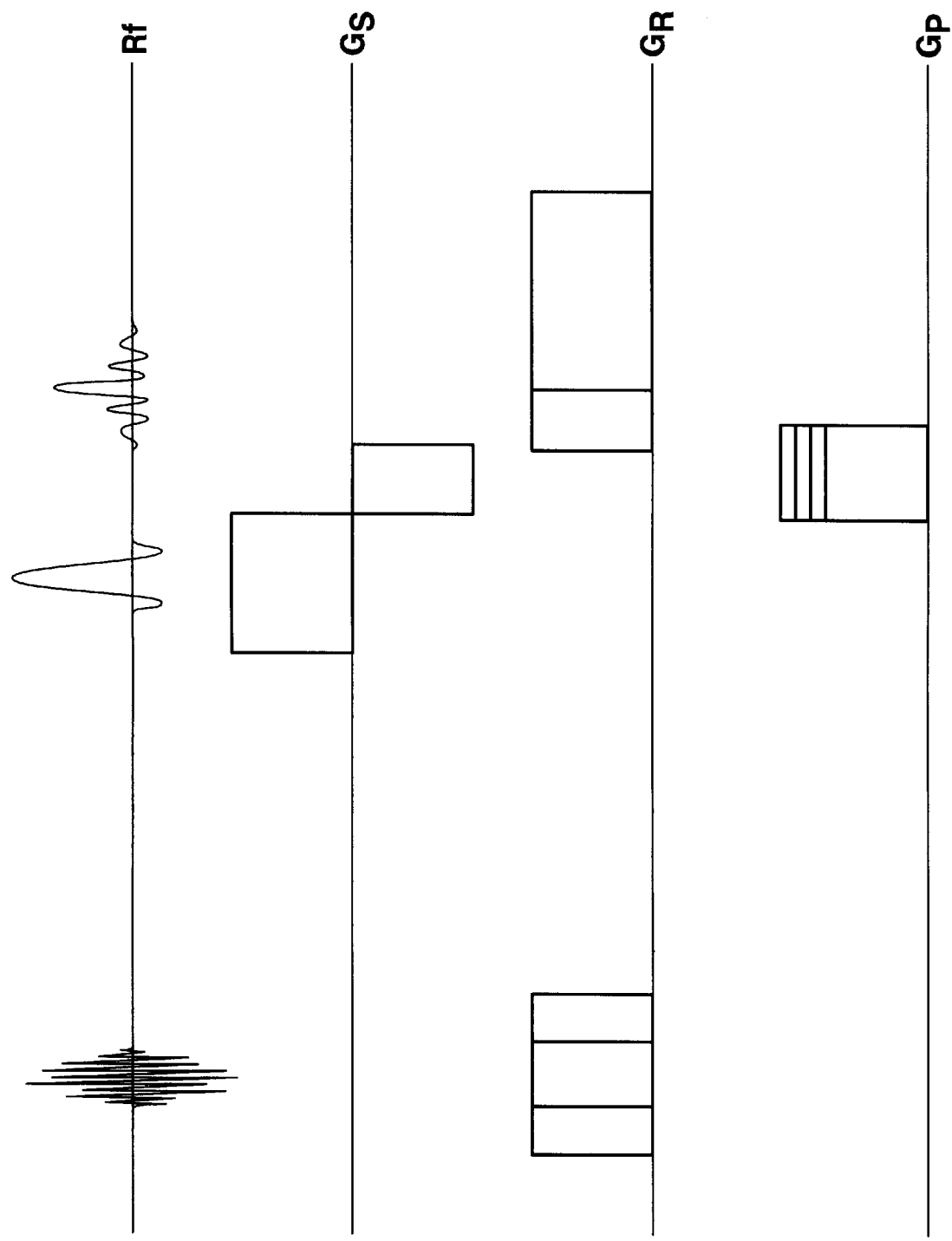
FIG. 9 illustrates an embodiment of the invention for a second imaging application.

Embodiments of the measurement sequence described can be immediately extracted through application of methods described in the literature based on the formation of conventional stimulated echoes. Application of the excitation mechanism described leads to a significant increase in signal intensity. By way of example, FIG. 8 shows an implementation of the method corresponding to FIGS. 4a–c as an imaging method having modulation for the z-magnetization in a direction of the slice selection gradient. FIG. 9 shows a corresponding method using signal modulation in the direction of the read gradient. Rf thereby designates the radio frequency pulse, and signals GS, GR and GP correspond to the slice selection, read and phase encoding gradients for imaging with the two-dimensional Fourier transformation method. Gradient pulses shown as grey sections illustrate the gradient periods necessary for signal formation. A corresponding application of this signal production principle to other methods is easily possible.

Several exemplary applications are indicated below in which use of the signal production principle in accordance with the invention appears to be particularly advantageous.

Measurement of Motion Processes, Coherent Motion

A particularly preferred application is measurement of motion processes. The measurement principle described allows both coherent motion as well as incoherent motion to be observed. Coherent motion hereby designates motion with which all spins move in the same direction within the respective observed volume and with the same velocity. The observed volume thereby means each partial volume within the sample which is detected by a separate NMR signal.

This observed volume can be the volume of the sample detected during the measurement. In magnetic resonance imaging applications, each image pixel is to be considered separately. Incoherent motion is motion with which the velocity vectors display no coherence.

Figure 10A:
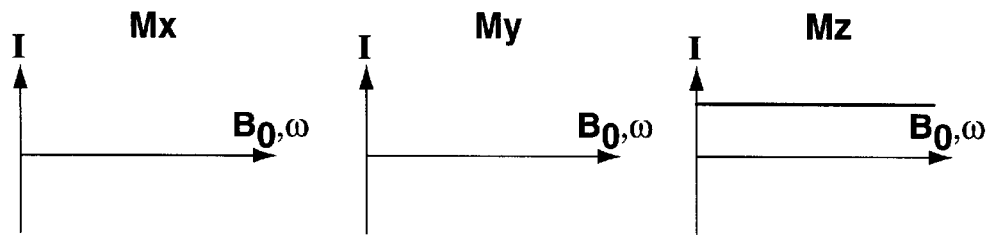
FIG. 10a illustrates an initial spin magnetization in a third embodiment of the invention with spins having coherent motion.
Figure 10B:
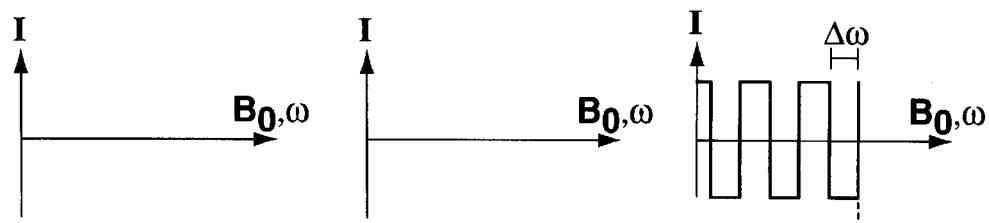
FIG. 10b shows the spin magnetization change with respect to FIG. 10a following a 180° modulation pulse.
Figure 10C:
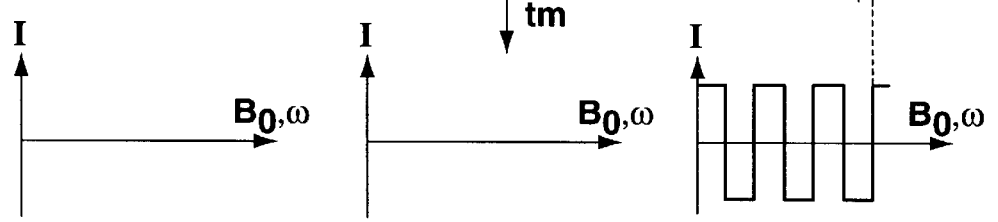
FIG. 10c shows the spin magnetization change with respect to FIG. 10b following a waiting time tm.
Figure 10D:
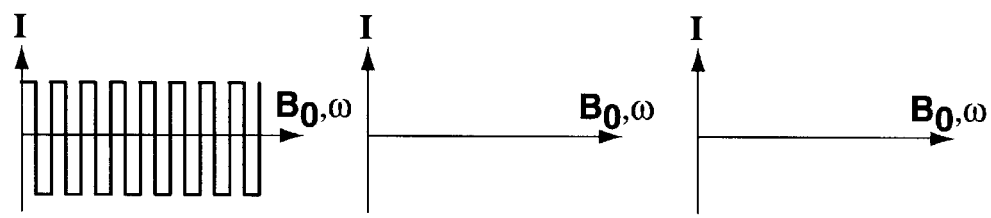
FIG. 10d shows the spin magnetization change with respect to FIG. 10c following a 90° modulation pulse.
Figure 11A:
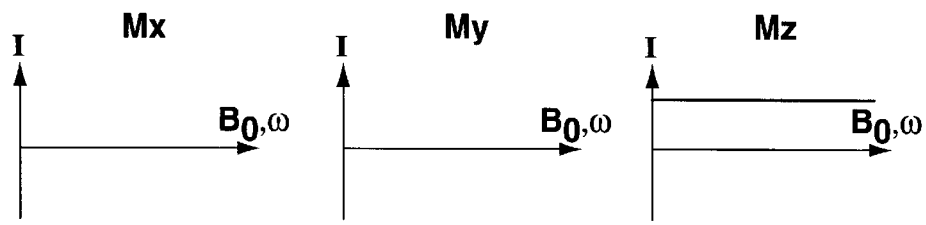
FIG. 11a illustrates an initial spin magnetization in a fourth embodiment of the invention with spins having incoherent motion.
Figure 11B:
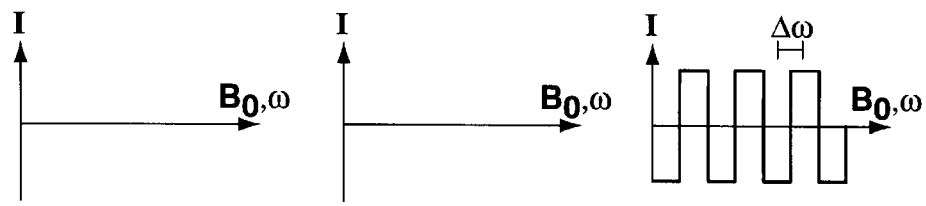
FIG. 11b shows the spin magnetization change with respect to FIG. 11a following a 180° modulation pulse.
Figure 11C:
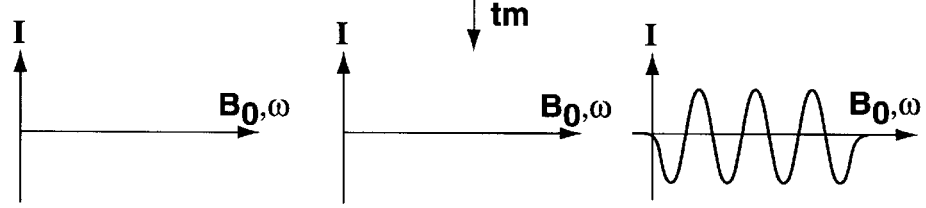
FIG. 11c shows the spin magnetization change with respect to FIG. 11b following a waiting time tm.
Figure 11D:
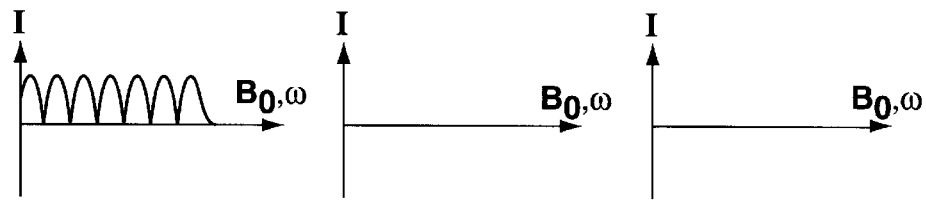
FIG. 11d shows the spin magnetization change with respect to FIG. 11c following a 90° modulation pulse.
Figure 12A:
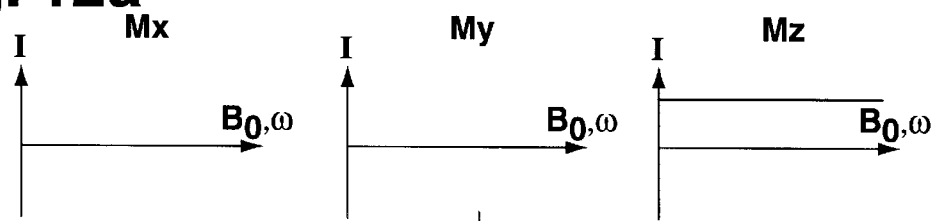
FIG. 12a illustrates an initial spin magnetization in a fifth embodiment of the invention in alternative measurement with spins having incoherent motion.
Figure 12B:
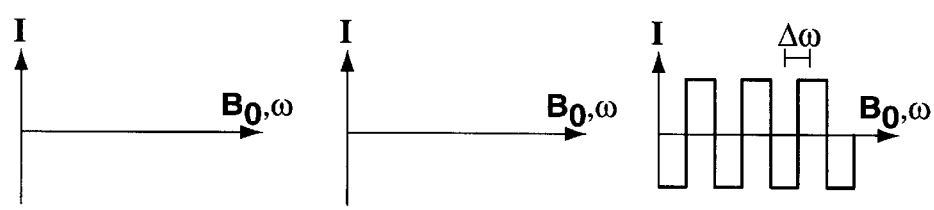
FIG. 12b illustrates the spin magnetization change with respect to FIG. 12a following a 180° modulation pulse.
Figure 12C:
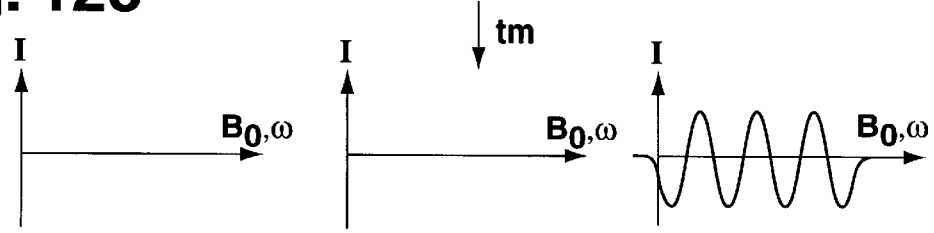
FIG. 12c shows the spin magnetization change with respect to FIG. 12b following a waiting time tm.
Figure 12D:
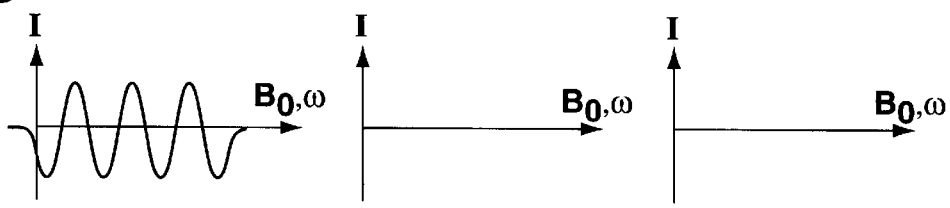
FIG. 12d shows the spin magnetization change with respect to FIG. 12c following a 90° read-out pulse.
Figure 12E:
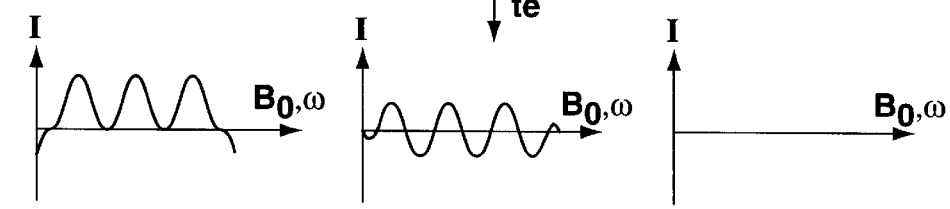
FIG. 12e shows the spin magnetization change with respect to FIG. 12d following a waiting time te.

A method for measuring coherent motion results from the fact that, when the profile of the z-modulated magnetization is displaced relative to the modulation excitation pulse in FIGS. 6a–6d, the signal is attenuated in dependence on the degree of displacement. A displacement by $\Delta\omega/2$ leads to the situation shown FIGS. 10a–d in which, instead of the z-magnetization echo (FIG. 6d) occurring in the stationary case, signal quenching occurs (FIG. 10d), since the transverse magnetization having a separation $\Delta\omega/2$ is periodically inverted such that the integral over Mx is equal to zero. Such a displacement is achieved for a velocity v=Sm/tm.

Figure 1E:
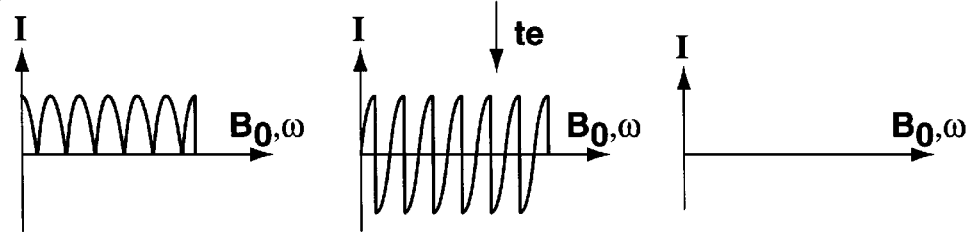
FIG. 1e shows the spin magnetization change with respect to FIG. 1d following a waiting time te.

Refocusing, however, then occurs, in analogy to the situation shown in FIG. 1e, following $t=1/\Delta\omega$. The intensity of this delayed echo, in the event of a perfect rectangular excitation shape, is once more $2/\pi$. As can easily be shown, the signal intensity decreases linearly as a function of v in the region of $0<v<2S_m$ from 1 to −1, whereas that of the delayed echo increases for $0<v<S_m$ from 0 to $2/\pi$, and, subsequently once more decreases to 0. Measurement of the signal intensity as a function of tm thereby permits extraction of the velocity of the observed nuclei.

Incoherent Motion

Incoherent motion can be considered to be a superposition of coherent motions weighted in correspondence with the velocity distribution. In diffusion effected motion processes, the distribution profile $M_z(\omega)$ of the spins prepared by the original modulation pulse experiences a mixing according to the diffusion equations in dependence on tm. Mathematically, the diffusion effected distribution shape $M_z(\omega,t_m)$ is given by folding the modulated z-magnetization produced by the modulation pulse $M_z(\omega)$ with the diffusion equation:

$$M_z(\omega,t_m)=c\ M_z(\omega)*\exp(-x^2/4Dt).$$

(* hereby designates the folding product or convolution integral).

The originally produced spatial modulation of the magnetization is thereby erased through diffusion. Following renewed excitation by a modulation pulse, a reduction of the produced signal amplitude thereby occurs compared to the case shown in FIGS. 6a–d without diffusion (FIGS. 11a–d). If the average path length x' of diffusion given by the equation $$x'=\sqrt{Dt}$$

is equal to the width $\Delta\omega$ of the modulation, the modulation completely vanishes, and the intensity of the signal produced by the modulation pulse is zero.

A complementary type of diffusion measurement utilizes a pulse for renewed excitation having a simple rectangular shape. If no diffusion occurs during the evolution interval, the signal amplitude initially produced by this pulse is equal to 0. Subsequently, the z-magnetization echo corresponding to FIG. 12a–e is, however, produced. A change in the modulation of the magnetization by means of diffusion already causes the directly produced signal to be different from zero and effects a corresponding reduction in the subsequent z-modulation echo. The relationship between the amplitude of a directly produced signal and that of the z-modulation echo thereby depends on the diffusion constant as well as on the longitudinal relaxation time T1 with which the modulated magnetization returns to the (non-modulated) equilibrium state.

Extension to N-dimensional Modulation

Methods described up to this point are suitable for measurement of processes causing a change in z-magnetization along a one-dimensional modulation direction. An extension to two or three dimensional processes is easily possible. The corresponding modulation pulses must thereby simply be extended to a two or three dimensional modulation of the magnetization. Conceptionally easiest to understand is thereby the utilization of two or three modulation pulses of the above mentioned kind each having a modulation in one spatial direction.

More efficient, however, is use of numerically calculated multi-dimensional pulses producing such a two or three dimensional modulated magnetization. The diffusion related signal changes can, analogous to the case of one dimensional diffusion described above, then be separately calculated for each spatial direction if the modulation pattern is known.

Extension to Other Applications

A large number of experiments are known in the literature for both analytic NMR spectroscopy as well as for in vivo applications (MRS=magnetic resonance spectroscopy and MRI=magnetic resonance imaging) which are based on stimulated echoes. These experiments can easily be transformed into an experiment in accordance with the invention by one of average skill in the art using the above described principle of formation of z-modulated magnetization. The z-magnetization must thereby not necessarily be effected in the sense of a spatial modulation of the magnetization using magnetic field gradients (or the experimental field inhomogeneity). A modulation of the magnetization can also e.g. be created by the distribution of nuclei having differing chemical shifts as e.g. in a spectrum of a solid powder widened through anisotropy of the magnetic field tensor. An experiment in accordance with the invention can thereby e.g. determine the time constant for reorientation of the anisotropic molecules.

Intrinsically microscopic field gradients, for example in the vicinity of molecular distributed magnetic particles, can also be utilized in the sense of the method in accordance with the invention. Such intrinsic gradients occur in the vicinity of SPIO (superparamagnetic iron oxide) particles which are being increasingly used in medical applications. Naturally occurring substances such as deoxyhaemoglobin also have a strong magnetic moment leading to an intrinsic field gradient. The method in accordance with the invention can thereby be carried out in such a fashion that a modulation is achieved within the region of Larmor frequencies determined by the intrinsic field gradients.

I claim:

1. An NMR method for measuring NMR signals from a sample of magnetic spins, the method comprising the steps of:

a) locating the spins in an external magnetic field, wherein the spins have a distribution of Larmor frequencies in dependence on at least one of a type of nuclei, inhomogeneities in said external magnetic field, and an applied magnetic field gradient;

b) irradiating a first radio frequency pulse sequence to effect periodic modulation of z-magnetization of the spins at a modulation separation $2\Delta\omega$ relative to said distribution of Larmor frequencies;

c) waiting a time separation tm;
d) irradiating a second radio frequency pulse sequence to transfer said periodic modulation of z-magnetization into transverse magnetization of the spins, wherein at least one of said first and said second radio frequency pulse sequence has a periodic rectangular excitation shape of said modulation separation $2\Delta\omega$;
e) waiting a time in dependence on said modulation separation $2\Delta\omega$ for coherence of said transverse magnetization; and
f) measuring the NMR signal.

2. The method of claim 1, wherein said first radio frequency pulse sequence has a first rectangular excitation shape with said modulation separation $2\Delta\omega$ and said second radio frequency pulse has a second rectangular excitation shape with said modulation separation $2\Delta\omega$, wherein a first position of said first excitation shape is aligned, along a frequency axis, with a second position of said second excitation shape to effect coherence of said transverse magnetization directly after application of said second radio frequency pulse sequence.

3. The method of claim 2, wherein said distribution of Larmor frequencies is determined by an orientation distribution of molecules having spatially anisotropic magnetic moments.

4. The method of claim 2, wherein said first position is displaced by $\Delta\omega/2$ with respect to said second position to effect noticeable transverse magnetization for spins having positions which have changed between said first and said second radio frequency pulse sequences to suppress noticeable transverse magnetization from stationary spins.

5. The method of claim 4, wherein said distribution of Larmor frequencies is determined by an orientation distribution of molecules having spatially anisotropic magnetic moments.

6. The method of claim 1, wherein said distribution of Larmor frequencies is effected through local field inhomogeneities in consequence of properties of the sample, wherein said modulation separation $2\Delta\omega$, a pulse time sequence, and said time separation tm are chosen in such a fashion that positional changes of individual spins caused by diffusion change a spatial distribution of said modulation of z-magnetization to change an amplitude of the NMR signals produced by said second radio frequency pulse sequence in such a fashion that changes in signal intensities as a function of tm and $\Delta\omega$ can be used as a measurement of a kind and of a velocity of transport processes responsible for a change in individual spins.

7. The method of claim 6, wherein said distribution of Larmor frequencies is further effected through application of a time limited and changeable magnetic field gradient.

8. The method of to claim 7, wherein said modulation separation $2\Delta\omega$ is chosen to have an order of magnitude of an average diffusion path length within said time separation tm so that an attenuation of said signals effected by said second radio frequency pulse sequence facilitates measurement of a diffusion constant of molecules bearing the magnetic spins.

9. The method of claim 1, wherein said distribution of Larmor frequencies is determined by an orientation distribution of molecules having spatially anisotropic magnetic moments.

10. The method of claim 9, wherein said modulation separation $2\Delta\omega$, said pulse time sequence, and said time separation tm are chosen in such a fashion that an original modulation of said z-magnetization is changed through reorientation of molecules within said time separation tm.

* * * * *